United States Patent [19]
Watanabe

[11] Patent Number: 5,923,719
[45] Date of Patent: Jul. 13, 1999

[54] EXPOSURE APPARATUS AND DEVICE MANUFACTURING METHOD USING THE SAME

[75] Inventor: Yutaka Watanabe, Tochigi-ken, Japan

[73] Assignee: Canon Kabushiki Kaisha, Tokyo, Japan

[21] Appl. No.: 08/896,961

[22] Filed: Jul. 18, 1997

[30] Foreign Application Priority Data

Jul. 19, 1996 [JP] Japan .................................. 8-190913
Jan. 30, 1997 [JP] Japan .................................. 9-016236

[51] Int. Cl.$^6$ .................................................. G03G 15/04
[52] U.S. Cl. ............................................ 378/34; 378/146
[58] Field of Search ................................ 378/34, 43, 84, 378/85, 146

[56] References Cited

U.S. PATENT DOCUMENTS

| | | | |
|---|---|---|---|
| 5,123,036 | 6/1992 | Uno et al. | 378/34 |
| 5,125,014 | 6/1992 | Watanabe et al. | 378/34 |
| 5,394,451 | 2/1995 | Miyake et al. | 378/34 |
| 5,444,753 | 8/1995 | Hayashida et al. | 378/35 |
| 5,524,039 | 6/1996 | Kamon | 378/34 |
| 5,606,586 | 2/1997 | Amemiya et al. | 378/34 |
| 5,623,529 | 4/1997 | Ebinuma et al. | 378/34 |

FOREIGN PATENT DOCUMENTS

| | | | |
|---|---|---|---|
| 0068-528-A | 4/1985 | Japan | 378/34 |
| 2290-131-A | 12/1987 | Japan | 378/34 |
| 1-244400 | 9/1989 | Japan . | |

OTHER PUBLICATIONS

R.P. Haelbich, et al., "Design and Performance of an X–Ray Lithography Beam Line at a Storage Ring", *J. Vac. Sci. Tech. B*, Second Series, vol. 1, No. 4, Oct.–Dec. 1983, pp. 1262–1266.

Warren D. Grobman, "Handbook on Synchrotron Radiation", vol. 1, Chap. 13, pp. 1133 to 1139, North–Holland Publishing Co., 1983.

*Primary Examiner*—David P. Porta
*Attorney, Agent, or Firm*—Fitzpatrick, Cella, Harper & Scinto

[57] ABSTRACT

An exposure apparatus for projecting radiation light from a synchrotron radiation source to an object to be illuminated. The apparatus includes at least one set of flat surface mirrors disposed along a synchrotron radiation orbital plane and opposed to each other with a principal ray interposed therebetween and also disposed in two stages with respect to a direction of the principal ray. A first-stage flat surface mirror of the flat surface mirrors receives radiation light, emitted from the radiation source along the synchrotron radiation orbital plane, and reflects the same toward a second-stage flat surface mirror of the flat surface mirrors, which opposes the first-stage mirror with the principal ray direction interposed therebetween. At least one projection mirror receives radiation light from the flat surface mirrors and reflects and projects the same toward the object to illuminate it. The radiation light reflected by the second-stage flat surface mirror is deflected by the projection mirror to illuminate an effective region on the object, and the directions of the flat surface mirrors and the direction of radiation light impinging on them are placed in a predetermined relationship regarding a plane defined by radiation light emitted along the synchrotron radiation orbital plane.

12 Claims, 13 Drawing Sheets

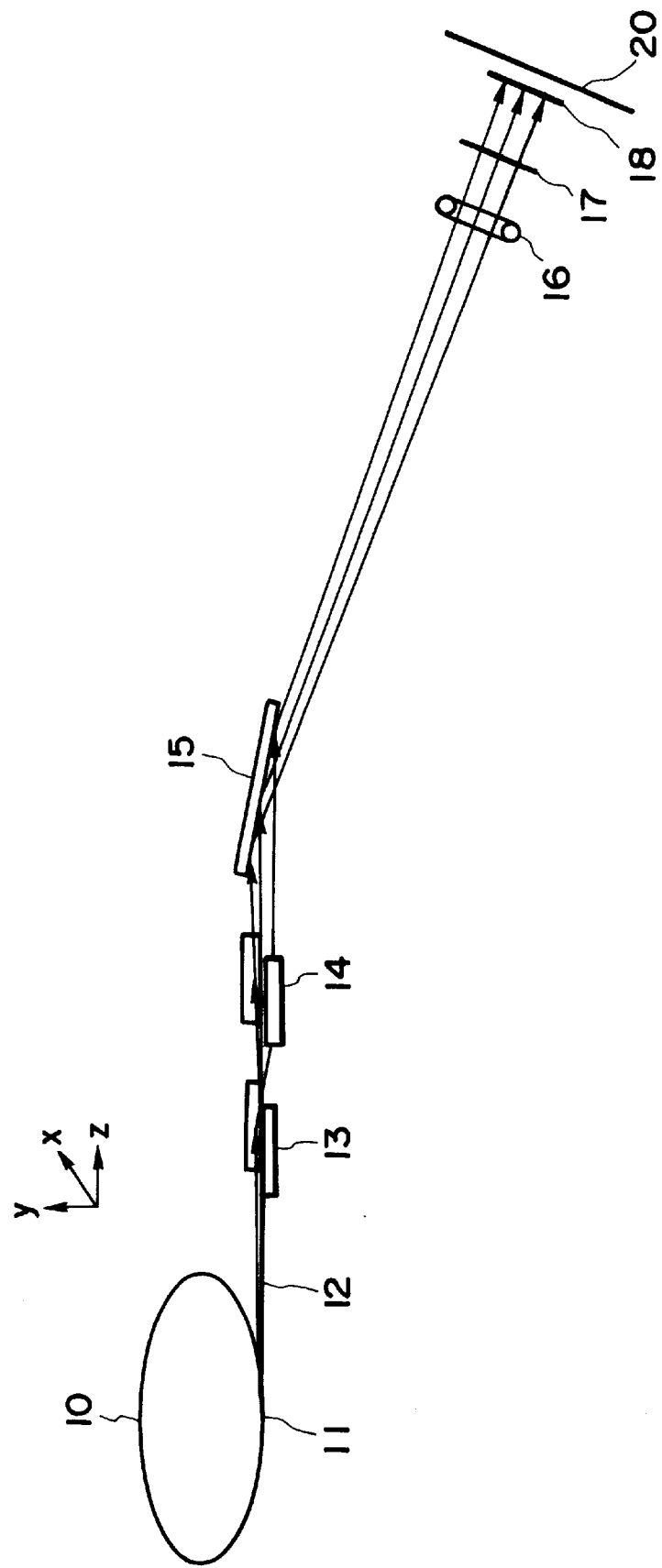

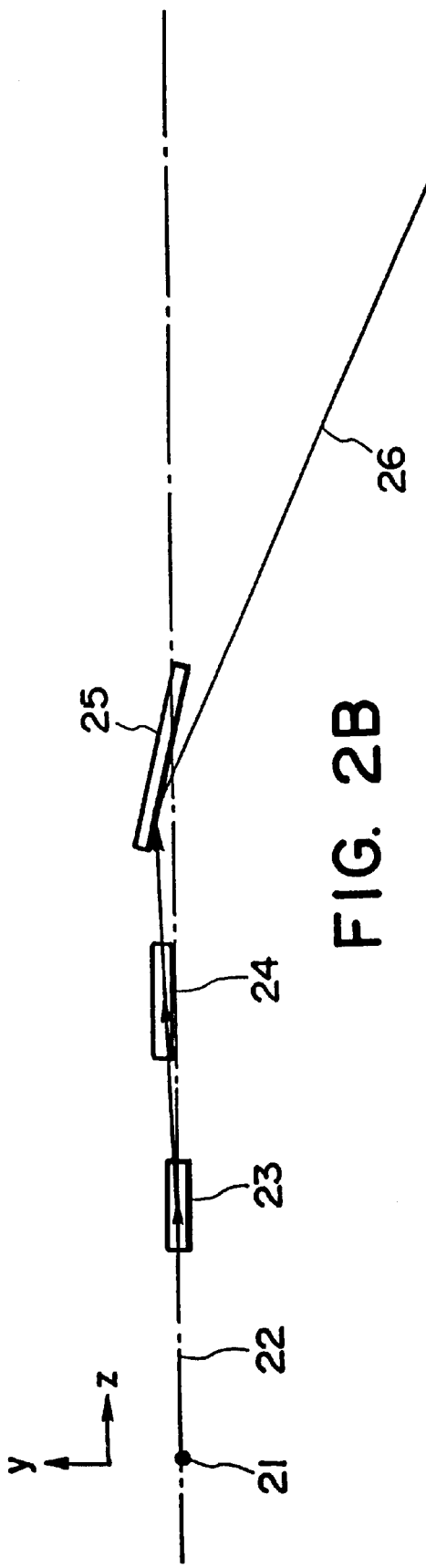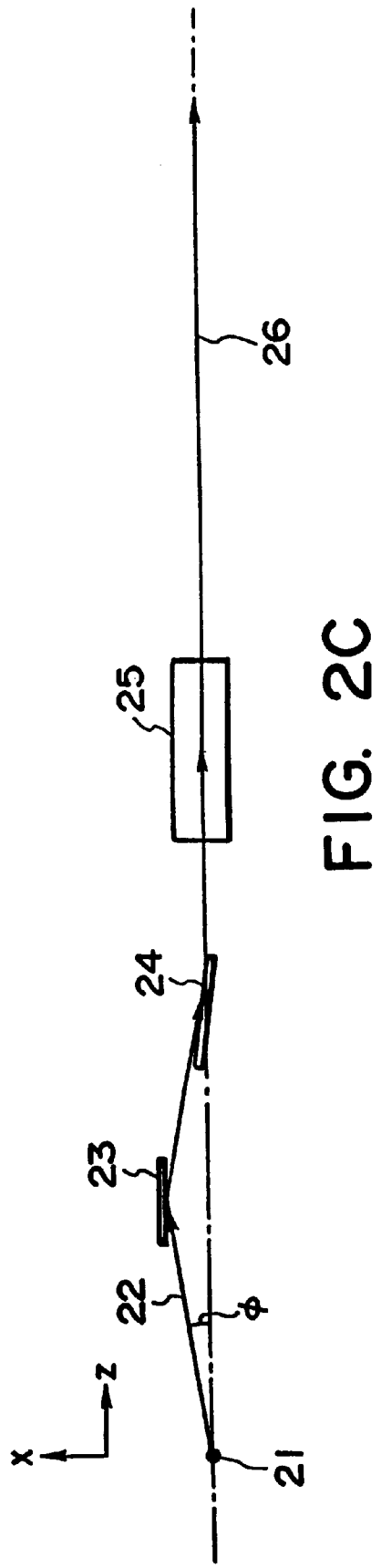

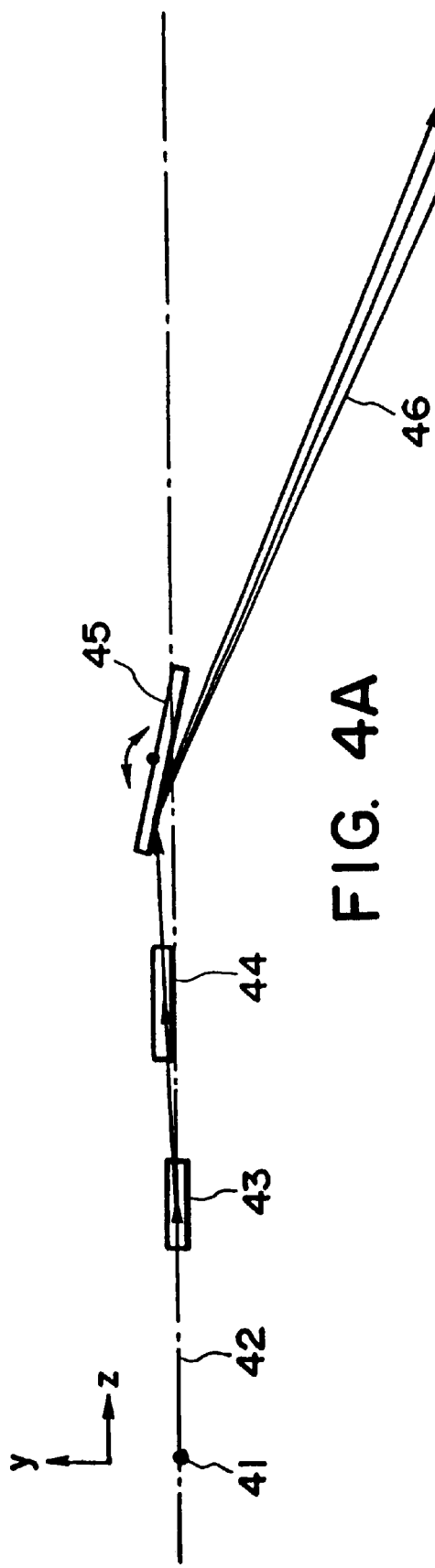
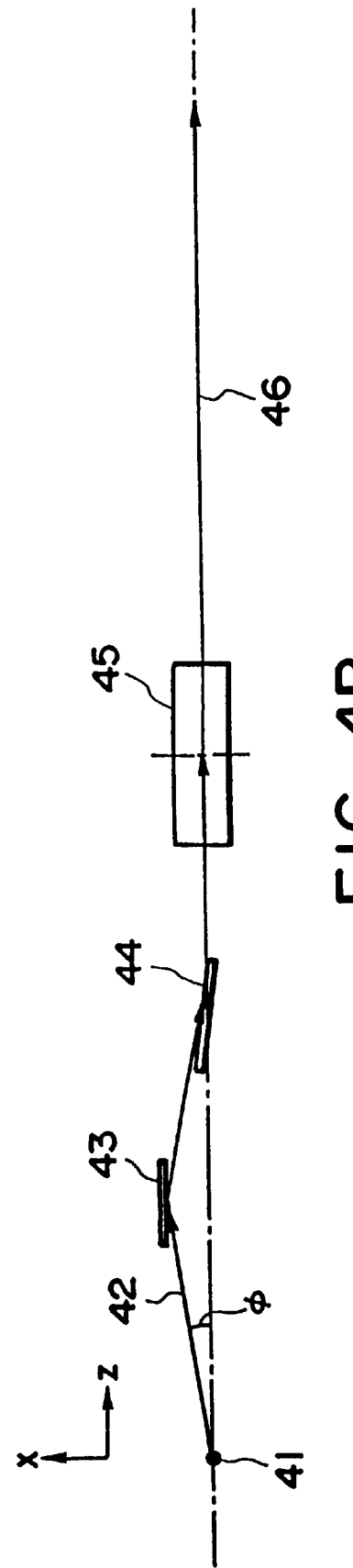
FIG. 4A
FIG. 4B

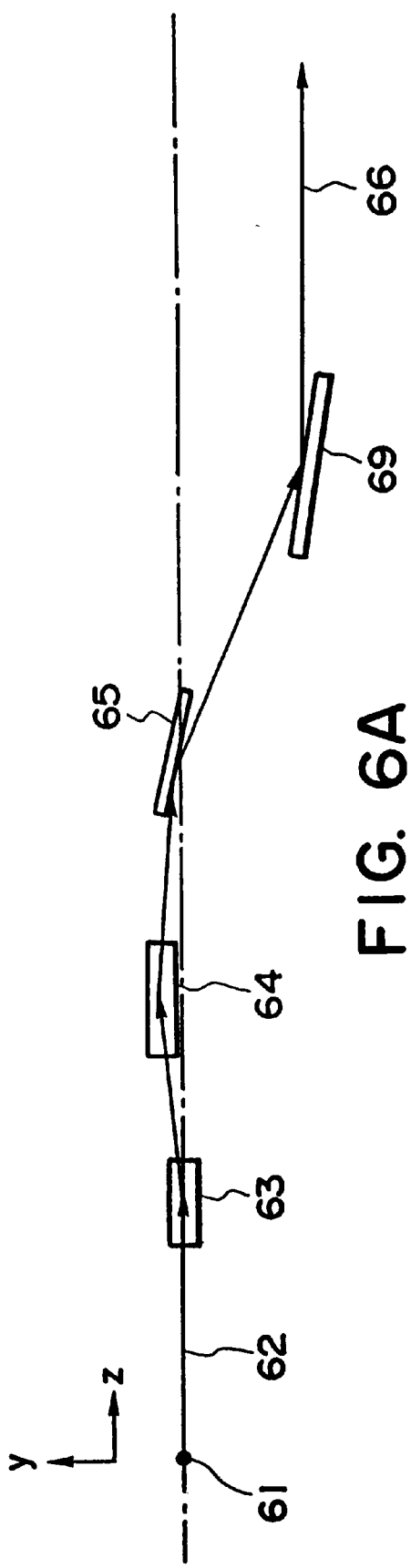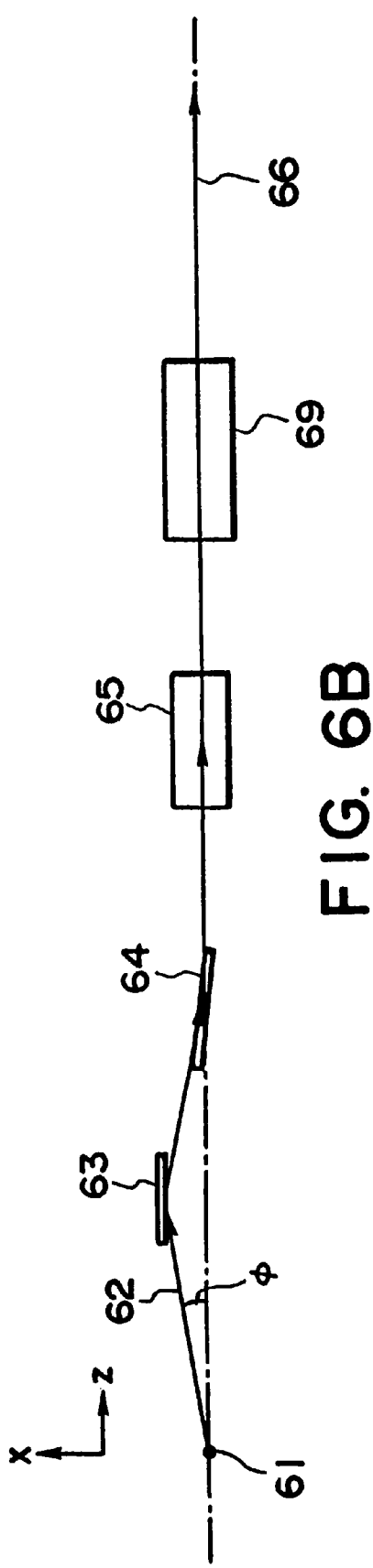

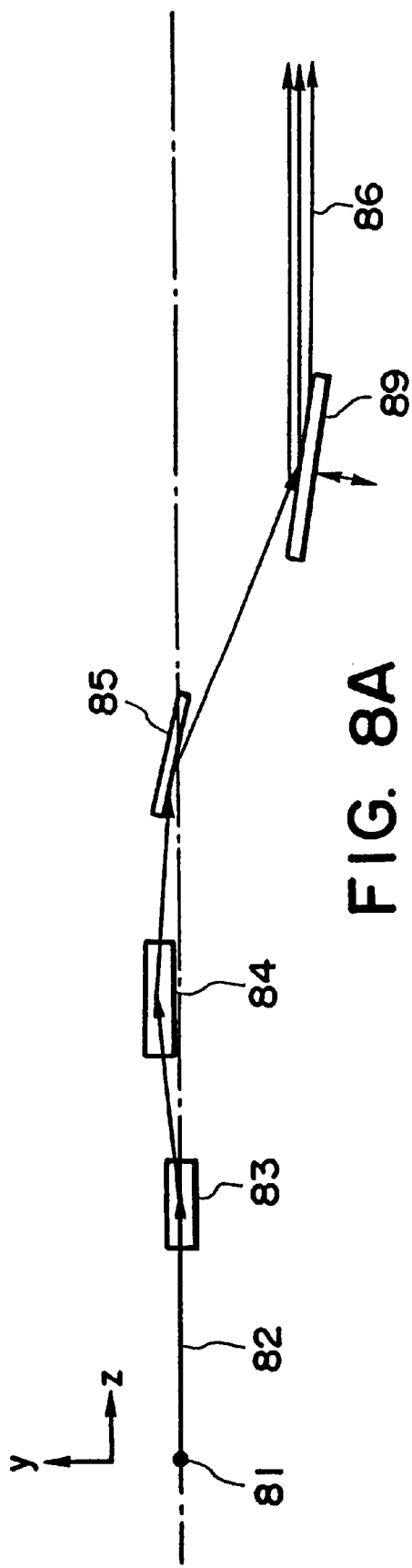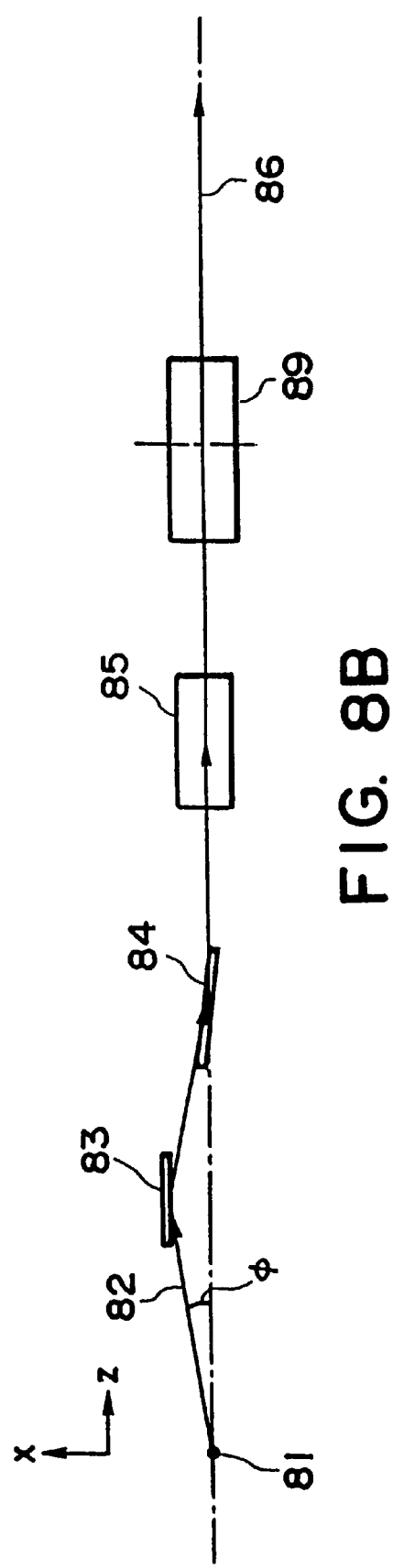

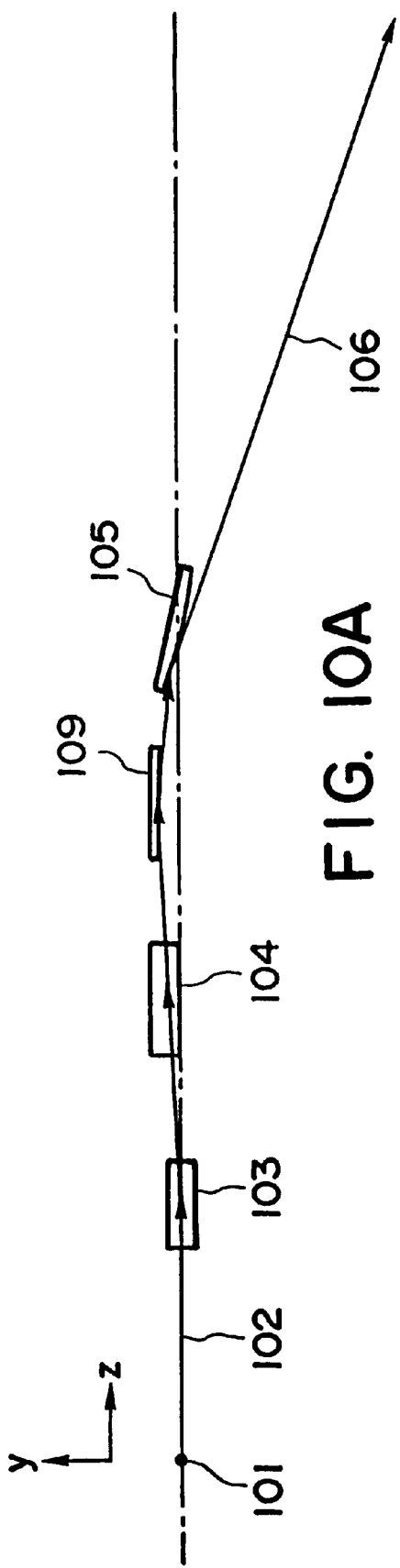
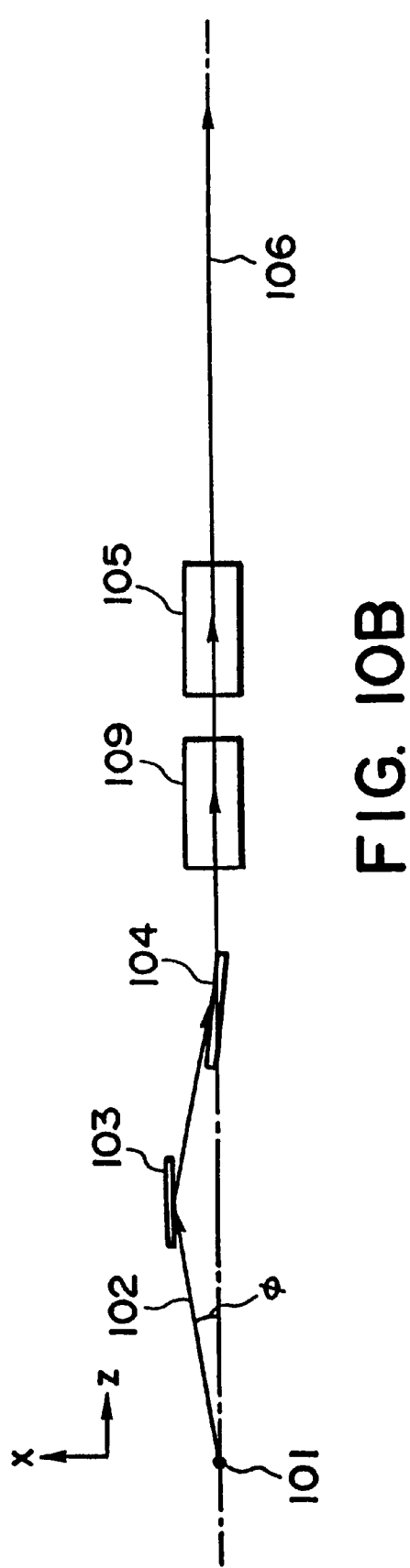

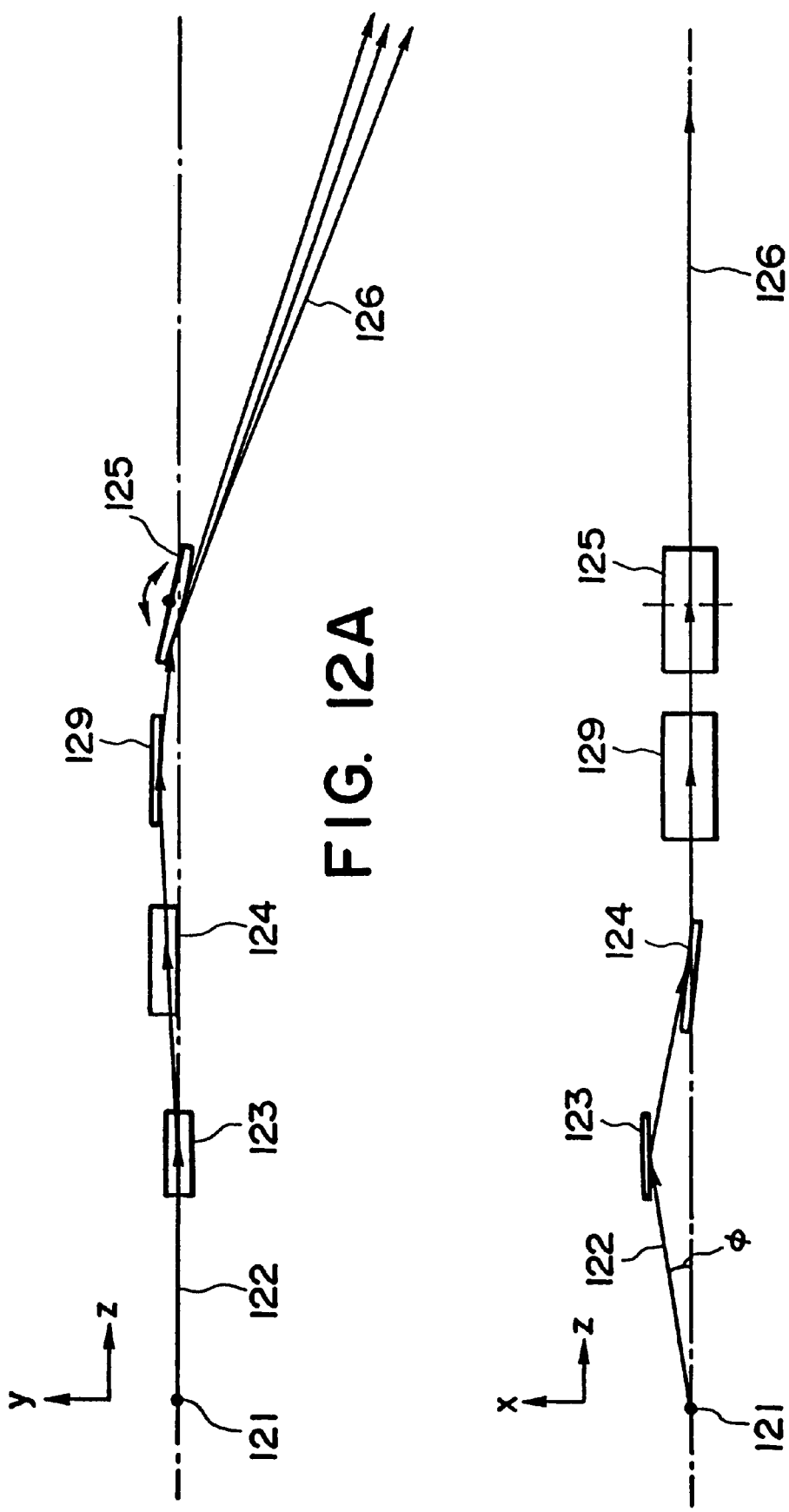

EXPOSURE APPARATUS AND DEVICE MANUFACTURING METHOD USING THE SAME

FIELD OF THE INVENTION AND RELATED ART

This invention relates to an exposure apparatus and, more particularly, to an exposure apparatus wherein a beam of X-rays or vacuum ultraviolet rays from a light source such as a synchrotron radiation source, for example, is expanded to enlarge an exposure region for an exposure process.

Usually, a synchrotron radiation (SR) light source provides a sheet-like beam of electromagnetic waves (containing X-rays or vacuum ultraviolet rays), which beam has a large divergence angle along an SR orbital plane (hereinafter, this will be referred to as the horizontal direction since usually the SR orbital plane is set along a horizontal plane) and has a small divergence angle along a direction perpendicular to the SR orbital plane (hereinafter, this will be referred to as the vertical direction). Because of a small divergence angle in the vertical direction, if SR light is projected directly, only a small range in vertical direction can be irradiated with it. In exposure apparatuses using such an SR light source, therefore, there is a necessity of expanding the X-ray exposure area to be irradiated with the SR light source, in the vertical direction.

Examples of expansion methods are:

1) An oblique projection (grazing) mirror is interposed between an SR light source and a surface to be exposed, and the mirror is oscillated by an angle of a few mrad. (R. P. Haelbich et al, "J. Vac. Sci. & Technol." B1(4), Oct.–Dec., 1988, pp. 1262–1266).

2) An oblique projection mirror with a shape of a curved surface is interposed between an SR light source and a surface to be exposed, and a divergence angle of an X-ray beam in the vertical direction is enlarged by the reflection of the beam by the curved mirror surface (Warren D. Grobman, "Handbook on Synchrotron Radiation", Vol.1, Chap.13, p. 1135, North-Holland Publishing Co., 1983).

3) As an improved form of example 2) above, the mirror shape is changed slightly from a cylindrical shape so that the curvature at a peripheral portion is continuously reduced (Japanese Laid-Open Patent Application, Laid-Open No. 244400/1989). This is intended to enlarge the divergence angle of the X-ray beam in the vertical direction, with an effect of uniform intensity. FIG. 1 shows an exposure apparatus of this example. Denoted in the drawing at 131 is a light emission point, and denoted at 132 is a mirror. Denoted at 133 is a mask. SR light from the emission point 131 is received by a mirror 132 of a specific shape, by which the divergence angle in the vertical direction is enlarged. The light is then projected on the mask 133.

These examples, however, involve some inconveniences. In example 1), only a portion of the surface to be exposed can be irradiated with the beam at every moment. This may cause a local expansion of the exposure mask. The effect of such an expansion could not be removed unless the mirror vibration period is sufficiently short, and there would remain a difficulty of accurate transfer of a fine pattern. On the other hand, a large drive power is necessary to provide a sufficiently short vibration period. This is practically difficult.

In example 2), on the other hand, the surface to be exposed can be irradiated at once as required. Thus, the problem involved in example 1) can be removed with this method. However, because of the use of a cylindrical mirror shape, there is another problem of a large loss of energy when the beam is expanded. Further, it is difficult to collect the large divergence angle of sheet-like electromagnetic waves in the horizontal direction and, therefore, in this method, with respect to the horizontal direction, the SR light only in an angle defined by the light emission point to the exposure region can be utilized.

As regards example 3), although the problem of a large loss of energy in the beam expansion may be removed with this method, still there is a similar problem that the SR light only in the angle defined by the emission point to the exposure region can be utilized, as in example 2). Although in this method the intensity to be projected to the surface to be exposed can be improved significantly as compared with example 2), it is still necessary to use some measures to increase the intensity of a light source more or, alternatively, to improve the sensitivity of a resist more. This necessarily results in an increased cost of the SR light source or enlargement of the size of the SR light source. Alternatively, it results in an increase of cost, for development of the resist material.

There is a further example which may be an improved form of example 1) in the point of collecting a large divergence angle of sheet-like electromagnetic waves in the vertical direction. More specifically, an oblique projection mirror is formed with a curvature of a concaved surface in a direction perpendicular to an optical axis of SR light, and the mirror is oscillated by an angle of a few mrad. while collecting the SR light. With this method, however, only a portion of the surface to be exposed can be irradiated with the beam at every moment. Thus, there is a similar problem as in example 1), that is, it is difficult to assure accurate transfer of a fine pattern unless the mirror oscillation period is shortened sufficiently.

SUMMARY OF THE INVENTION

It is an object of the present invention to provide an exposure apparatus by which a surface to be exposed as required can be illuminated at once to thereby ensure accurate transfer of a fine pattern, and by which a large divergence angle of SR light (a sheet-like electromagnetic wave) in a horizontal direction can be collected to thereby assure enlargement of the intensity to be projected to the surface to be exposed and, thus, assure improvement of throughput, without necessity of enlargement of the intensity of the light source.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2A is a schematic and perspective view of an exposure apparatus according to a first embodiment of the present invention.

FIGS. 2B and 2C are schematic views, respectively, for explaining the relation between a light emission point and a mirror, wherein FIG. 2B is a side view and FIG. 2C is a top plan view.

FIGS. 4A and 4B are schematic views for explaining the relation between an emission point and a mirror, wherein FIG. 4A is a side view and FIG. 4B is a top plan view.

FIGS. 6A and 6B are schematic views for explaining the relation between an emission point and a mirror, wherein FIG. 6A is a side view and FIG. 6B is a top plan view.

FIGS. 8A and 8B are schematic views for explaining the relation between an emission point and a mirror, wherein FIG. 8A is a side view and FIG. 8B is a top plan view.

FIGS. 10A and 10B are schematic views for explaining the relation between an emission point and a mirror, wherein FIG. 10A is a side view and FIG. 10B is a top plan view.

FIGS. 12A and 12B are schematic views for explaining the relation between an emission point and a mirror, wherein FIG. 12A is a side view and FIG. 12B is a top plan view.

DESCRIPTION OF THE PREFERRED EMBODIMENTS

Figure 1:
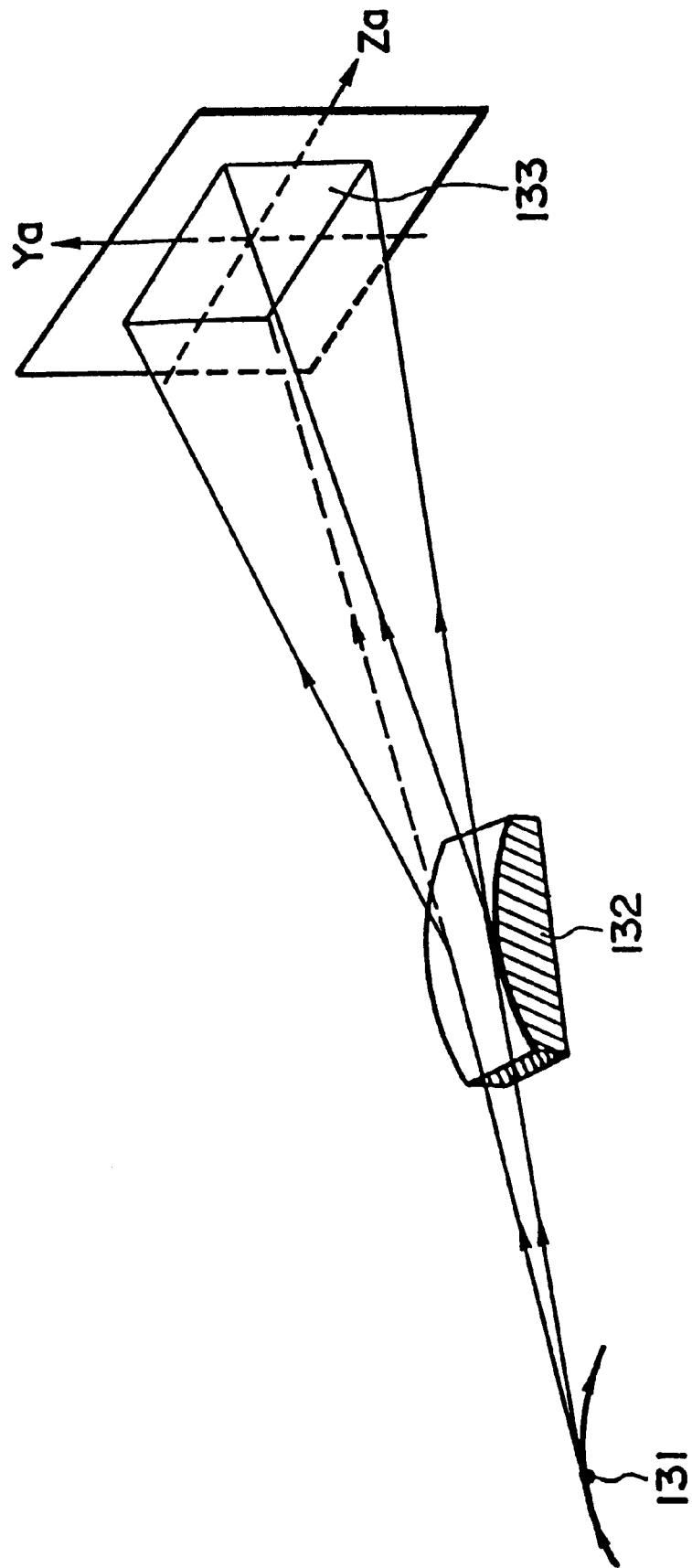
FIG. 1 is a schematic and perspective view of an exposure apparatus of a known type.

Generally, an exposure apparatus according to the present invention, for projecting radiation light emitted by a synchrotron radiation (SR) source, to an object to be irradiated, includes at least one set of flat mirrors which are disposed along a synchrotron radiation orbital plane and opposed to each other with a principal ray interposed therebetween and also which are disposed in two stages with respect to the principal ray direction, and one or more projection mirrors for receiving radiation light from the flat mirrors and for projecting the light to the object to be illuminated. The flat mirrors disposed in two stages are arranged so that the first-stage flat mirror receives radiation light emitted from a synchrotron radiation (SR) light source, along an SR orbital plane and with a large divergence angle, and reflects the same toward the second-stage mirror oppositely disposed with the principal ray interposed therebetween. The radiation light reflected by this second-stage flat mirror goes via the projection mirror by which the path is changed to enable illumination of an effective region on the object. Additionally, the directions of these flat mirrors as well as the direction of radiation light impinging on them are placed in a certain relationship, to ensure that the plane, as defined by the radiation light emitted along the SR orbital plane and deflected by the second-stage flat mirror, is not rotated about the principal ray direction as compared with the SR orbital plane.

A portion of the radiation light may be projected directly on the projection mirror from the SR light source, such that it may be projected on the object to be illuminated, together with the radiation light coming from the flat mirrors disposed in two stages.

At least one of the projection mirrors may be made swingable so that an effective region on the object may be illuminated with the illumination region being extended with the oscillation of that mirror. A shutter may be disposed between the projection mirror and the object to be irradiated, and the direction of operation of the shutter may be coincident with the direction of oscillation of the swingable projection mirror.

The projection mirror for projecting light to the object may be provided by a single flat mirror or a single spherical mirror or, alternatively, a single cylindrical mirror. As a further alternative, it may be provided by a combination of one spherical mirror and one flat mirror, or a combination of two substantially opposed flat mirrors, disposed successively from the flat mirrors in two stages, with one cylindrical mirror. As a further alternative, it may be provided by a combination of two substantially opposed flat mirrors, disposed successively from the flat mirrors in two stages, with a single spherical mirror.

The object to be irradiated may be a mask, and a pattern of the mask may be transferred onto a substrate.

A device manufacturing apparatus according to an embodiment of the present invention is applicable to device manufacture on the basis of an exposure apparatus such as described above.

In an embodiment of the present invention, two flat mirrors which are easy in machining are disposed substantially opposed to each other, and radiation light emitted along an SR orbital plane at a large angle, away from the principal ray direction of the radiation light, is deflected by these mirrors so that the path is changed to illuminate the effective region on the object to be illuminated. This enables effective utilization of radiation light, which could not be used for illumination of the object without the use of the two flat mirrors.

In an embodiment of the present invention, a certain relationship is established between the direction of the two flat mirrors and the direction of the emitted radiation light, by which the path is changed so that via a projection mirror the radiation illuminates the effective region on the object and, also by which it is ensured that the plane as defined by radiation light emitted along the SR orbital plane and after being reflected by the two mirrors is not rotated about the principal ray direction as compared with the SR orbital plane before the reflection. More specifically, the radiation light emitted along the SR orbital plane and then reflected by the two flat mirrors has an intensity distribution in the vertical direction, the same direction as that of the intensity distribution of the light before being reflected by the mirrors. An additional single spherical mirror or cylindrical mirror may be used to enlarge the divergence angle of an X-ray radiation beam in the vertical direction or, alternatively, to project the light in a desired direction. This accomplishes illumination of the effective region on the object to be illuminated.

The radiation light reflected by the first-stage and second-stage mirrors and then impinging on the projection mirror and the radiation light passing through a clearance between the first-stage and second-stage mirrors and directly impinging on the projection mirror may have different coordinates (substantially in terms of y coordinates) in the vertical direction of the object to be illuminated. Thus, the region of radiation light projected on the object can be enlarged.

At least one of the projection mirrors may be made swingable. By projecting light to the effective region on the object to be illuminated while expanding the illumination region with the oscillation of that mirror, the region on the object illuminated by the light can be enlarged as compared with a case where the projection mirror is not oscillated.

Now, preferred embodiments of the exposure apparatus for use in the semiconductor device manufacturing method of the present invention will be described with reference to the drawings. FIG. 2A is a schematic and perspective view of a first embodiment of the present invention. FIGS. 2B and 2C are schematic views for explaining the relation between the light emission point and mirrors, wherein FIG. 2B is a side view and FIG. 2C is a top plan view. Denoted in these drawings at 10 is a synchrotron radiation (SR) light source, and denoted at 11 or 21 is a light emission point. Denoted at 12 or 22 is synchrotron radiation (SR) light, and denoted at 13 or 23 is a first-stage flat mirror. Denoted at 14 or 24 is a second-stage flat mirror, and denoted at 15 or 25 is a third-stage flat mirror (projection mirror). Denoted at 16 is a shutter, and denoted at 17 is an X-ray transmission window. Denoted at 18 is a mask, and denoted at 20 is a wafer substrate. Denoted at 26 is SR light directed to the mask.

An electron orbit of SR light source 10 is illustrated as a circular orbit, for simplicity. Practically, it may have a race track shape, a rectangular shape or any other shape. As the electron orbit is bent by a bending magnet, SR light 12 or 22 is emitted in a tangential direction. In this embodiment, SR light 12 or 22 emitted from the emission point 11 or 21 with a large angle is reflected by the first-stage flat mirror 13 or 23 and, after that, it is reflected by the second-stage flat mirror 14 or 24. Here, as shown in FIG. 2A, the first-stage mirror 13 and the second-stage mirror 14 each comprises one set of (two) mirrors which are effective to reflect two fluxes of SR light, respectively, emitted at a large angle on both sides of the principal ray and impinging on these mirrors.

A coordinate system is set such as shown in FIG. 2A, wherein the y axis is taken vertically and upwardly along the SR orbital plane, wherein the z axis is taken along a tangent to a certain point (light emission point) upon the SR electron orbit and in the direction of emission of the SR light (principal ray direction of the SR light), and wherein the x axis is taken on a direction perpendicular to both the y and z axes. The x and z axes are thus included in the SR orbital plane. The center of the mask 18 is placed on a plane which is at substantially x=0, that is, in the y-z plane. The SR light ray which emits in the z axis direction from the emission point is referred to as the principal ray.

In FIG. 2B, for simplicity, only SR light emitted in the positive x direction at an angle ø is illustrated. The SR light reflected by the second-stage mirrors 14 and 24 is then reflected by the third-stage flat mirrors (projection mirrors) 15 and 25, and the light is directed toward the mask 18. After this, the light passes an opening of the shutter 16, for controlling the exposure amount, and it passes through the X-ray transmission window 17. Then, the light is projected on the mask 18. The SR light passing through the mask 18 is then projected onto the wafer substrate 20, which is coated with a resist material.

In this embodiment, as shown in FIG. 2A, a portion of the SR light emitted in the principal ray direction is not reflected by any of the first-stage flat mirrors 13 and 23 and second-stage flat mirrors 14 and 24, and it goes through the clearance between these opposed mirrors. It is directly reflected by the third-stage flat mirrors 15 and 25, and is projected toward the mask 18. However, such SR light impinging directly on the third-stage flat mirror may be omitted.

The SR light comprises a beam of sheet-like electromagnetic waves having a large divergence angle with respect to a horizontal direction (direction contained in the SR orbital plane) and having a small divergence angle with respect to a vertical direction (direction perpendicular to the SR orbital plane). It contains X-rays and/or vacuum ultraviolet rays. As regards the SR light having a large divergence angle with respect to the horizontal direction, in an exact sense, it is not emitted from a single emission point, but it is emitted tangentially from points on the SR electron orbit. Here, SR light which comes from an SR electron orbit of a length that is sufficiently small that it can be considered to be a single light emission point, is regarded as SR light coming from one light emission point with a divergence angle corresponding to the length of that electron orbit.

In this embodiment, two flat mirrors which are easy in machining are disposed substantially opposed to each other. SR light rays emitted along the SR orbital plane at a large angle, away from the principal ray of the SR light, are deflected by the mirrors so that they illuminate the effective region on the mask. This enables an effective utilization of outside SR light which could not be used for mask irradiation without the two flat mirrors.

While the SR light projected within the SR orbital plane defines one plane (as a matter of course, it is an SR orbital plane), after it is reflected by the two flat mirrors it still defines one plane, similarly. The plane of the SR light as defined after reflection with the two flat mirrors is, generally, not parallel to the SR orbital plane before reflection by the mirrors. Thus, there is rotation about the principal ray direction of the SR light. While the SR light emitted along the SR orbital plane has a uniform intensity, the intensity of the SR light emitted in the vertical direction is not even, but it has an approximately Gaussian distribution. Therefore, the SR light emitted along the SR orbital plane, after being reflected by the two flat mirrors, has its direction of intensity distribution changed from the direction of intensity distribution before being reflected by the mirrors.

In the present invention and, particularly, in second and later embodiments to be described, a certain relationship is established between the direction of two flat mirrors and the direction of the emitted SR light, by which the light path is changed to ensure illumination of an effective region of a mask. In addition, the plane as defined by the SR light emitted along the SR orbital plane and reflected by the two mirrors is prevented from being rotated about the principal ray direction of the SR light as compared with the SR orbital plane before reflection by the mirrors. More specifically, after the SR light emitted along the SR orbital plane is reflected by the two flat mirrors, the direction of the intensity distribution thereof is kept in vertical direction which is the same as the direction of the intensity distribution before reflection by the mirrors. Additionally, one spherical mirror or cylindrical mirror may be used for this SR light to thereby enlarge the divergence angle with respect to the vertical direction of the X-ray beam. Alternatively, one flat mirror may be used to project light in a desired direction, to assure illumination of an effective region on a mask.

A certain relationship to be established between the direction of the two flat mirrors and the direction of the emitted SR light, will now be explained in greater detail.

As shown in FIG. 2B, vectors of SR light emitted from an emission point along a horizontal plane, with an angle ø, can be expressed by:

$$(\sin\phi, 0, \cos\phi).$$

If the angle defined between the normal vector of the first-stage mirror and the z axis is $\beta_1$ ($0 \leq \beta_1 \leq \pi$) and the angle defined with respect to the x axis by projection, onto the x-y plane, of the normal vector of the first-stage mirror is $\alpha_1$ ($0 \leq \alpha_1 \leq 2\pi$), the normal vector of the first mirror is expressed as:

$$(\cos\alpha_1\sin\beta_1, \sin\alpha_1\sin\beta_1, \cos\beta_1).$$

Also, if the angle defined between the normal vector of the second-stage mirror and the z axis is $\beta_2$ ($0 \leq \alpha_2 \leq \pi$) and the angle defined with respect to the x axis by projection, on to x-y plane, of the normal vector of the second-stage mirror is $\alpha_2$ ($0 \leq \alpha_2 \leq 2\pi$), the normal vector of the second mirror is expressed as:

$$(\cos\alpha_2\sin\beta_2, \sin\alpha_2\sin\beta_2, \cos\beta_2),$$

Regarding the vector ($\sin\phi$, 0, $\cos\phi$) of the SR light emitted along a horizontal plane and the vector ($\cos\phi$, 0, $-\sin\phi$) which is perpendicular to the vector of the SR light and which is within the horizontal plane, those vectors which are plane symmetrical with respect to the first-stage mirror may be detected and, then, regarding these vectors, those which are plane symmetrical with respect to the second-stage mirror may be detected. By doing so, the vector of the SR light emitted along the horizontal plane after being reflected by the two mirrors as well as the vector perpendicular to that vector can be determined. The y component of the vector which is perpendicular to the vector of the SR light after being reflected by the two mirrors can be determined as follows:

$$2[-\{1 - 2\cos^2\alpha_1\sin^2\beta_1\}\cos\phi + 2\cos\alpha_1\sin\beta_1\cos\beta_1\sin\phi\} \times$$
$$\sin\alpha_2\cos\alpha_2\sin^2\beta_2 +$$
$$(-\sin\alpha_1\cos\alpha_1\sin^2\beta_1\cos\phi + \sin\alpha_1\sin\beta_1\cos\beta_1\sin\phi) \times$$
$$(1 - 2\sin^2\alpha_2\sin^2\beta_2) -$$
$$\{-2\cos\alpha_1\sin\beta_1\cos\beta_1\cos\phi +$$
$$(1 - 2\sin^2\beta_1)\sin\phi\}\sin\alpha_2\sin\beta_2\cos\beta_2]$$

If the y component is zero, it means that the plane as defined by the SR light emitted along the SR orbital plane, after being reflected by the two mirrors, is not rotated about the principal ray direction of the SR light as compared with the SR orbital plane before reflection. In summary, when the following relation is present among the direction $\alpha_1$, $\beta_1$ of the first-stage mirror, the direction $\alpha_2$, $\beta_2$ of the second-stage mirror and the direction $\pi$ of emitted SR light:

$$-\{(1 - 2\cos^2\alpha_1\sin^2\beta_1)\cos\phi + 2\cos\alpha_1\sin\beta_1\cos\beta_1\sin\phi\} \times \quad (1)$$
$$\sin\alpha_2\cos\alpha_2\sin^2\beta_2 + (-\sin\alpha_1\cos\alpha_1\sin^2\beta_1\cos\phi +$$
$$\sin\alpha_1\sin\beta_1\cos\beta_1\sin\phi) \times (1 - 2\sin^2\alpha_2\sin^2\beta_2) -$$
$$\{-2\cos\alpha_1\sin\beta_1\cos\beta_1\cos\phi +$$
$$(1 - 2\sin^2\beta_1)\sin\phi\}\sin\alpha_2\sin\beta_2\cos\beta_2 = 0,$$

the plane defined by the SR light emitted along the SR orbital plane, after being reflected by the two mirrors, is kept unrotated about the principal ray direction of the SR light as compared with the SR orbital plane before being reflected.

This relationship applies when the two mirrors are disposed opposed exactly. More specifically, it applies when relations $$\alpha_2 = \alpha_1 + \pi$$
$$\beta_2 = \pi - \beta_1 \quad (2)$$

are satisfied, independently of the value of $\phi$. On that occasion, however, the direction of light after being reflected by the two flat mirrors is unchanged. Thus, even by using an additional spherical mirror or cylindrical mirror for the SR light after being reflected by the two flat mirrors to enlarge the divergence angle of the X-ray beam in the vertical direction, or even by using one flat mirror to project light in a desired direction, it may not be attainable to illuminate an effective region on the mask. It is therefore, seen that a solution that satisfies the two conditions of equation (2) may not be preferable.

The best is when equation (1) is satisfied, since the plane defined by the SR light emitted along the SR orbital plane, after being reflected by the two mirrors, is not rotated about the principal ray direction of the SR light as compared with the SR orbital plane before the reflection. However, as compared with the SR orbital plane before reflection, a small rotation of about 5 mrad about the principal ray direction of the SR light is well within the scope of the present invention. Thus, an absolute value of equation (1) not greater than 0.0025 is acceptable.

Concerning, specifically, the mirrors shown in FIG. 2B, in this embodiment, $\phi = 17.5$ mrad $\alpha_1 = 2.902$ rad $\beta_1 = 13.0$ mrad $\alpha_2 = -0.240$ rad $\beta_2 = 22.0$ mrad.

Thus, equation (1) is satisfied. Consequently, the plane defined by the SR light projected along the SR orbital plane and reflected by the second-stage mirror 24 is not rotated about the principal ray direction of the SR light. Also, under these conditions, as shown in FIG. 2C, since there is substantially no rotation of the SR light reflected by the second-stage mirror 24 about the y axis, relative to the principal ray, there occurs substantially no variation in the x component particularly when the light reaches the mask. Under the conditions above, the two mirrors are in a relation:

$\alpha_1 - \alpha_2 \approx \pi$ and, since $\beta_1$ and $\beta_2$ are sufficiently small, the two mirrors are disposed substantially opposed to each other.

Regarding the light ray on a side of the principal ray, opposite to the light ray of FIG. 2, that is, for example:

$\phi = -17.5$ mrad, the angles of the two mirrors may be:

$\alpha_1 = -0.240$ rad $\beta_1 = 13.0$ mrad $\alpha_2 = 2.902$ rad $\beta_2 = 22.0$ mrad.

By this, equation (1) is satisfied and, additionally, a set of SR lights emitted at a large angle to both sides of the principal ray can be directed toward the mask without any interference of the mirrors.

Further, in this embodiment, a set of SR lights emitted at a large angle on both sides of the principal ray are reflected by two sets of mirrors which are in a revolutionally symmetrical relation around the principal ray, as shown in FIG. 2A. Thus, these SR lights are superposed one upon another on the mask, and it is effective to provide an intensity distribution on the mask which is easy to correct.

Furthermore, since the SR light reflected by the first-stage and second-stage flat mirrors and then reflected by the third-stage flat mirror and the SR light passing through the clearance between the first-stage and second-stage mirrors and directly reflected by the third-stage flat mirror have different coordinates (approximately, the y coordinate) in the vertical direction of the mask, the region on the mask to be irradiated with the SR light is expanded.

As a consequence of the above, the path of the SR light emitted with a large angle is changed and light is collected and projected on the mask. Thus, there are advantageous effects of increased intensity as well as enlargement of the region to be irradiated with the SR light.

The description regarding a certain relationship to be established between the direction of the two flat mirrors and the direction of emitted SR light, having been made above, will basically apply to other embodiments to be described later.

In this embodiment, the third-stage mirror which is a projection mirror for illuminating the mask comprises a single flat mirror. However, it may be provided by one spherical mirror or cylindrical mirror.

Figure 3:
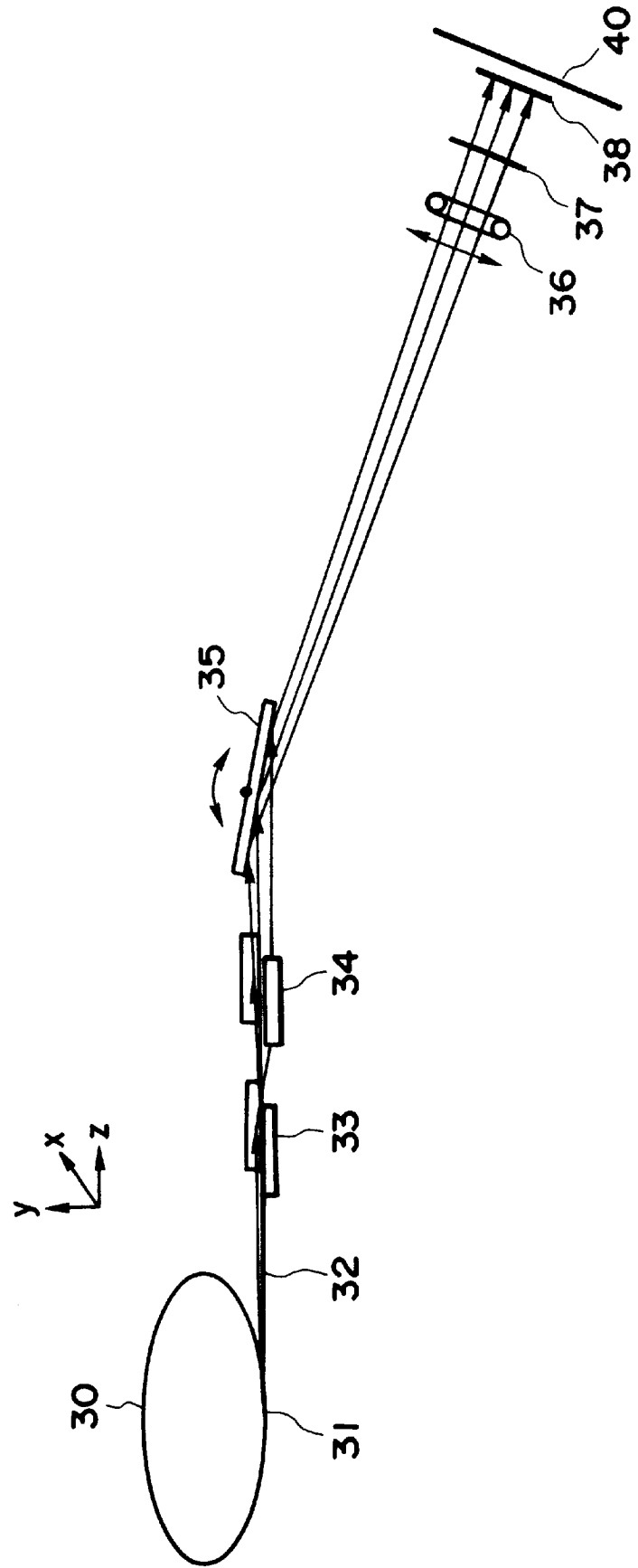
FIG. 3 is a schematic and perspective view for explaining a second embodiment of the present invention.

Next, a second embodiment of the present invention will be explained, in conjunction with the drawings. FIG. 3 is a schematic and perspective view of a second embodiment of the present invention. FIGS. 4A and 4B are schematic views for explaining the relationship between an emission point and mirrors, wherein FIG. 4A is a side view and FIG. 4B is a top plan view. Denoted in these drawings at 30 is an SR light source, and denoted at 31 or 41 is a light emission point. Denoted at 32 or 42 is SR light, and denoted at 33 or 43 is a first-stage flat mirror. Denoted at 34 or 44 is a second-stage flat mirror, and denoted at 35 or 45 is a third-stage mirror (projection mirror). Denoted at 36 is a shutter, and denoted at 37 is an X-ray transmission window. Denoted at 38 is a mask, and denoted at 40 is a wafer substrate. Denoted at 46 is SR light projected toward the mask.

In this embodiment, the third-stage flat mirrors 35 and 45 which are held fixed in the first embodiment are made swingable as indicated by an arrow in FIG. 3, adjacent to the third flat mirror 35, with its axis of rotation being in the horizontal plane, such that reflected SR light is diffused vertically. As seen in FIG. 4, with the oscillation of the third-stage flat mirror 35, the SR light impinging on the same point on the third-stage flat mirror 45 can be formed, after the reflection, into SR light 46 having an extension in the vertical direction. In other words, with the oscillation of the third-stage flat mirrors 35 and 45, an extension is produced in the SR light in the vertical direction as compared with the case where the mirrors are fixed.

In an X-ray exposure apparatus, the reflectivity changes largely with an incidence angle to a mirror and, therefore, rotation of the mirror causes an intensity distribution in the direction in which the SR light is expanded, that is, in the vertical direction in this embodiment. The shutter 36 is made movable in the direction in which the SR light is expanded with the mirror oscillation, that is, in the vertical direction as depicted by an arrow in FIG. 3, adjacent to the shutter 36. This effectively cancels the intensity distribution caused by rotation of the mirror, and uniform exposure is assured.

More specifically, in this embodiment, a set of SR lights emitted with a large angle on both sides of the principal ray are reflected by two sets of mirrors which are disposed in a revolutionally symmetrical relation with each other about the principal ray, as shown in FIG. 3, and, additionally, the third-stage flat mirror which receives the light projected from these mirrors is oscillated. With this structure, the SR lights are superposed one upon another on the mask, and a distribution of intensity which is easy to correct is provided on the mask.

Further, the SR light reflected by the first-stage and second-stage flat mirrors and then reflected by the third-stage flat mirror and the SR light passing through the clearance between the first-stage and second-stage mirrors and directly reflected by the third-stage flat mirror have different coordinates (mostly y coordinates) in the vertical direction of the mask. Thus, the region of SR light impinging on the mask is widened.

As a result, SR light emitted with a large angle is collected on the mask by deflection of the light path, whereby the intensity is increased. Also, the region to be irradiated with the SR light is enlarged and, additionally, uniformization of exposure intensity is accomplished.

The structure and function of the remaining portion of this embodiment are essentially the same as those of the first embodiment, and a description thereof will be omitted here. While in this embodiment the third-stage flat mirror has been explained as being a single flat mirror, it may be provided by one spherical mirror or cylindrical mirror.

Figure 5:
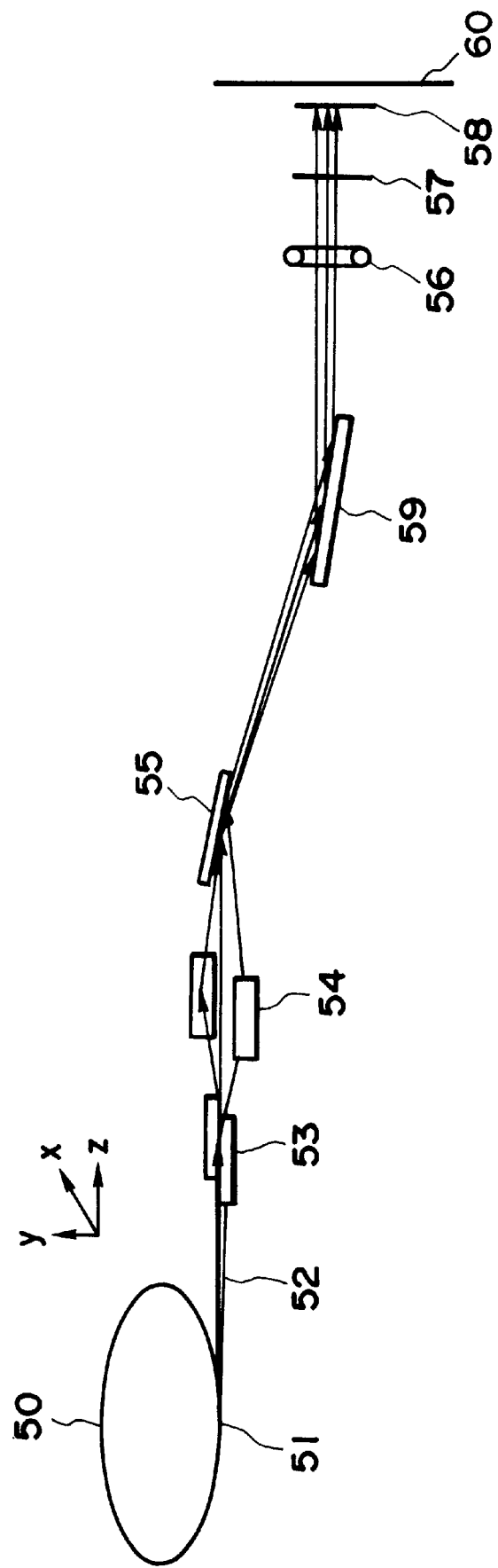
FIG. 5 is a schematic and perspective view for explaining a third embodiment of the present invention.

Next, a third embodiment of the present invention will be explained, in conjunction with the drawings. FIG. 5 is a schematic and perspective view of a third embodiment of the present invention. FIGS. 6A and 6B are schematic views for explaining the relationship between an emission point and mirrors, wherein FIG. 6A is a side view and FIG. 6B is a top plan view. Denoted in these drawings at 50 is an SR light source, and denoted at 51 or 61 is a light emission point. Denoted at 52 or 62 is SR light, and denoted at 53 or 63 is a first-stage flat mirror. Denoted at 54 or 64 is a second-stage flat mirror, and denoted at 55 or 65 is a third-stage spherical surface mirror. Denoted at 56 is a shutter, and denoted at 57 is an X-ray transmission window. Denoted at 58 is a mask, and denoted at 60 is a wafer substrate. Denoted at 66 is SR light projected toward the mask.

An electron orbit of an SR light source is illustrated as a circular orbit, for simplicity. In this embodiment, SR light 52 or 62 emitted from the emission point 51 or 61 with a large angle is reflected by the first-stage flat mirror 53 or 63 and, after that, it is reflected by the second-stage flat mirror 54 or 64. Here, as shown in FIG. 5A, the first-stage mirror 53 and the second-stage mirror 54 each comprises one set of (two) mirrors which are effective to reflect two fluxes of SR light, respectively, emitted at a large angle on both sides of the principal ray and impinging on these mirrors. In FIG. 6B, for simplicity, only SR light emitted in the positive x direction at an angle 0 is illustrated. The SR light reflected by the second-stage mirrors 54 and 64 is then reflected by the third-stage spherical surface mirrors 55 and 65, whereby the divergence angle is enlarged in the vertical direction. After that, the direction of SR light is changed by fourth-stage flat mirrors 59 and 69, and the light is directed toward the mask 58. Then, the light passes an opening of the shutter 56, for controlling the exposure amount, and it passes through the X-ray transmission window 57. Then, the light is projected on the mask 58. The SR light passing through the mask 58 is then projected onto the wafer substrate 60, which is coated with a resist material.

In this embodiment, as shown in FIG. 5, the SR light emitted in the principal ray direction is not reflected by any of the first-stage flat mirrors 53 and 63 and second-stage flat mirrors 54 and 64, and it goes through the clearance between these opposed mirrors. It is directly reflected by the third-stage spherical mirrors 55 and 65 whereby the divergence angle is enlarged, and then it is reflected by the fourth-stage flat mirror whereby it is projected toward the mask 58. However, such SR light as directly reflected by the third flat mirror may be omitted.

Also, in this embodiment, the angles of the first-stage and second-stage mirrors are so set as to satisfy equation (1), and, therefore, the plane as defined by SR light emitted along the SR orbital plane and reflected by the second-stage mirror 64 is not rotated about the principal ray direction of SR light as compared with the SR orbital plane before reflection.

Further, in this embodiment, like the first embodiment, a set of SR lights emitted at a large angle on both sides of the principal ray are reflected by two sets of mirrors which are in a revolutionally symmetrical relation around the principal ray, as shown in FIG. 5. Thus, these SR lights are superposed one upon another on the mask, and an intensity distribution of an intensity which is easy to correct is provided on the mask.

Furthermore, since the SR light reflected by the first-stage and second-stage flat mirrors and the SR light directly impinging from the light source are reflected by the third-stage spherical mirror, the region on the mask to be irradiated with SR light is expanded.

As a consequence of the above, SR light emitted at a large angle can be projected on the mask such that increased intensity is assured. Also, enlargement of region to be irradiated with SR light is accomplished.

While, in this embodiment, the projection mirror for projecting light to the mask has been explained as a combination of a third-stage spherical mirror and a fourth-stage flat mirror, a desired combination of two of flat mirrors, spherical mirrors and cylindrical mirrors may be used.

Figure 7:
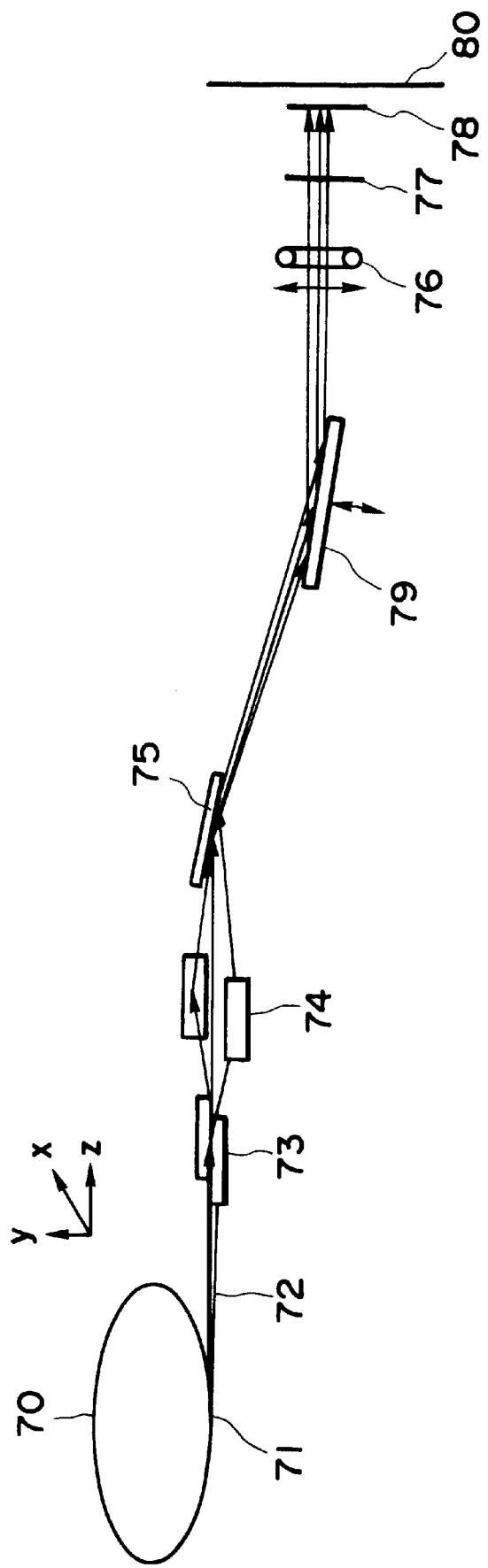
FIG. 7 is a schematic and perspective view for explaining a fourth embodiment of the present invention.

Next, a fourth embodiment of the present invention will be explained, in conjunction with the drawings. FIG. 7 is a schematic and perspective view of a second embodiment of the present invention. FIGS. 8A and 8B are schematic views for explaining the relationship between an emission point and mirrors, wherein FIG. 8A is a side view and FIG. 8B is a top plan view. Denoted in these drawings at 70 is an SR light source, and denoted at 71 or 81 is a light emission point. Denoted at 72 or 82 is SR light, and denoted at 73 or 83 is a first-stage flat mirror. Denoted at 74 or 84 is a second-stage flat mirror, and denoted at 75 or 85 is a third-stage spherical mirror (projection mirror). Denoted at 76 is a shutter, and denoted at 77 is an X-ray transmission window. Denoted at 78 is a mask, and denoted at 79 or 80 is a projection mirror (fourth-stage flat mirror). Denoted at 80 is a wafer substrate, and denoted at 86 is SR light projected toward the mask.

In this embodiment, the fourth-stage flat mirrors 79 and 89, which are held fixed in the third embodiment, are made swingable substantially in the vertical direction, as depicted by an arrow in FIG. 7, adjacent to the fourth flat mirror 79, such that reflected SR light is diffused vertically. As seen in FIGS. 8A and 8B, with the oscillation of the fourth-stage flat mirror 89, the SR light impinging on the same point on the fourth-stage flat mirror 89 can be formed, after the reflection, into SR light 86 having an extension in the vertical direction. In other words, with the oscillation of the third-stage flat mirrors 79 and 89, an extension is produced in the SR light in the vertical direction as compared with the case where the mirrors are fixed.

In an X-ray exposure apparatus, the reflectivity changes largely with an incidence angle to a mirror and, therefore, rotation of the mirror causes an intensity distribution in the direction in which SR light is expanded, that is, in the vertical direction in this embodiment. The shutter 76 is made movable in the direction in which the SR light is expanded with the mirror oscillation, that is, in the vertical direction as depicted by an arrow in FIG. 7, adjacent to the shutter 76. This effectively cancels the intensity distribution caused by rotation of the mirror, and uniform exposure is assured.

More specifically, in this embodiment, a set of SR lights emitted with a large angle on both sides of the principal ray are reflected by two sets of mirrors which are disposed in a revolutionally symmetrical relation with each other about the principal ray, as shown in FIG. 7, and, additionally, the third-stage flat mirror which receives the light projected from these mirrors is oscillated. With this structure, the SR lights are superposed one upon another on the mask, and a distribution of an intensity which is easy to correct is provided on the mask.

Further, the SR light reflected by the firststage and second-stage flat mirrors and then reflected by the third-stage spherical mirror and the SR light passing through the clearance between the first-stage and second-stage mirrors and directly reflected by the third-stage spherical mirror have different coordinates (mostly y coordinates) in the vertical direction of the mask. Thus, the region of SR light impinging on the mask is widened.

As a result, SR light emitted with a large angle is collected on the mask by deflection of the light path, whereby the intensity is increased. Also, the region to be irradiated with SR light is enlarged and, additionally, uniformization of exposure intensity is accomplished.

The structure and function of the remaining portion of this embodiment are essentially the same as those of the third embodiment, and a description thereof will be omitted here. While, in this embodiment, the third-stage flat mirror has been explained as a single flat mirror, it may be provided by one spherical mirror or cylindrical mirror.

Figure 9:
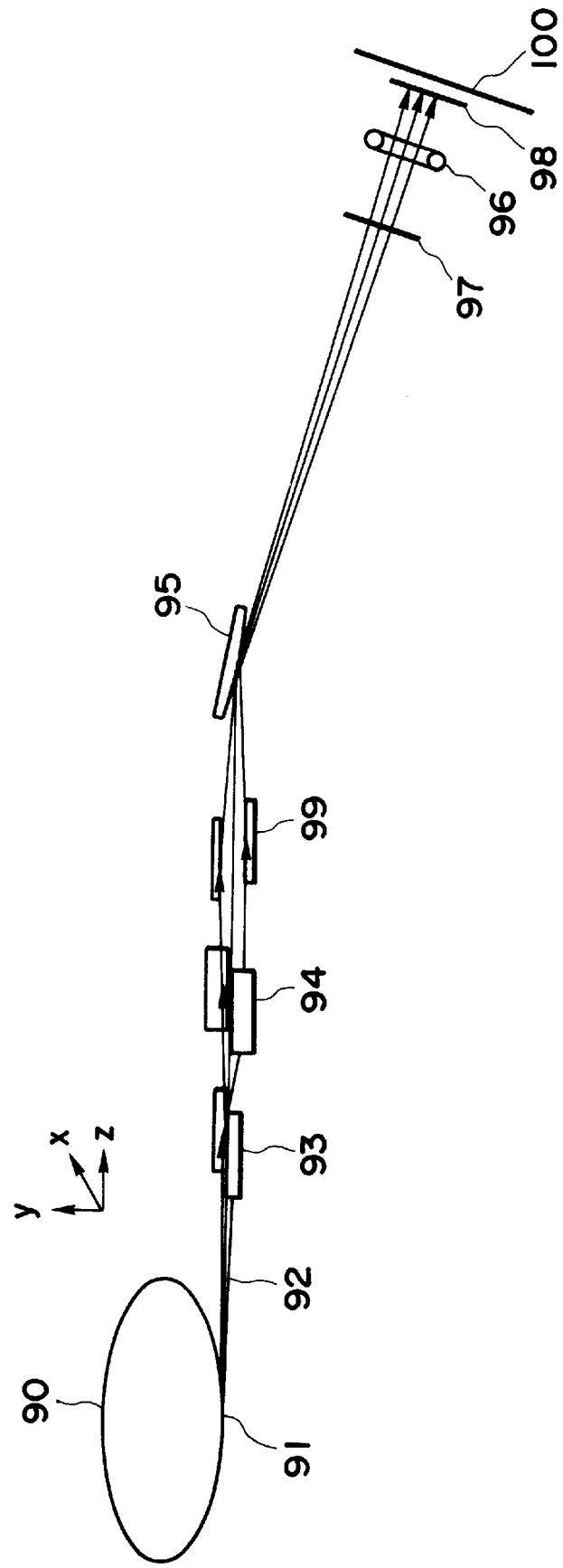
FIG. 9 is a schematic and perspective view for explaining a fifth embodiment of the present invention.

Next, a fifth embodiment of the present invention will be explained, in conjunction with the drawings. FIG. 9 is a schematic and perspective view of a fifth embodiment of the present invention. FIGS. 10A and 10B are schematic views for explaining the relationship between an emission point and mirrors, wherein FIG. 10A is a side view and FIG. 10B is a top plan view. Denoted in these drawings at 90 is an SR light source, and denoted at 91 or 101 is a light emission point. Denoted at 92 or 102 is SR light, and denoted at 93 or 103 is a first-stage flat mirror. Denoted at 94 or 104 is a second-stage flat mirror, and denoted at 95 or 105 is a projection mirror (fourth-stage cylindrical surface mirror). Denoted at 96 is a shutter, and denoted at 97 is an X-ray transmission window. Denoted at 98 is a mask, and denoted at 99 or 100 is a projection mirror (third-stage flat mirror). Denoted at 9 is a wafer substrate, and denoted at 106 is SR light projected toward the mask.

An electron orbit of the SR light source is illustrated as a circular orbit, for simplicity. In this embodiment, SR light 92 or 102 emitted from the emission point 91 or 101 with a large angle is reflected by the first-stage flat mirror 93 or 103 and, after that, it is reflected by the second-stage flat mirror 94 or 104. Here, as shown in FIG. 9, the first-stage mirror 93 and the second-stage mirror 94 each comprises one set of (two) mirrors which are effective to reflect two fluxes of SR light, respectively, emitted at a large angle on both sides of the principal ray and impinging on these mirrors. In FIG. 10B, for simplicity, only SR light emitted in the positive x direction at an angle ø is illustrated. The SR light reflected by the second-stage mirrors 94 and 104 is then reflected by the third-stage flat surface mirrors 99 and 109, whereby the direction thereof is changed. It is then projected on the fourth-stage cylindrical mirrors 95 and 105, having a convex surface shape. The SR light whose divergence angle is enlarged in the vertical direction by the convex-surface cylindrical mirrors 95 and 105 is then directed toward the mask 98. Then, the light passes the X-ray transmission window 97 and goes through an opening of the shutter 96, for controlling the exposure amount. It is then projected on the mask 98. The SR light passing through the mask 98 is then projected onto the wafer substrate 100, which is coated with a resist material.

In this embodiment, as shown in FIG. 9, the SR light emitted in the principal ray direction is not reflected by any of the first-stage flat mirrors 93 and 103, second-stage flat mirrors 94 and 104, and a third-stage flat mirrors 99 and 109, and it goes through the clearance between these opposed mirrors. It is directly reflected by the fourth-stage cylindrical mirrors 95 and 105 whereby the divergence angle is enlarged in the vertical direction. The light is then projected toward the mask 98.

Also, in this embodiment, the angles of the first-stage and second-stage mirrors are so set as to satisfy equation (1), and, therefore, the plane as defined by SR light emitted along the SR orbital plane and reflected by the second-stage mirror 104 is not rotated about the principal ray direction of SR light as compared with the SR orbital plane before reflection.

Further, in this embodiment, like the first embodiment, a set of SR lights emitted at a large angle on both sides of the principal ray are reflected by two sets of mirrors which are in a revolutionally symmetrical relation around the principal ray, as shown in FIG. 9. Thus, these SR lights are superposed one upon another on the mask, and an intensity distribution of an intensity which is easy to correct is provided on the mask.

Furthermore, since the SR light reflected by the first-stage and second-stage flat mirrors as well as the third-stage flat mirrors and the SR light directly impinging from the light source are reflected by the fourth-stage cylindrical mirror, the region on the mask to be irradiated with SR light is expanded.

As a consequence of the above, SR light emitted at a large angle can be projected on the mask such that increased intensity is assured. Also, enlargement of a region to be irradiated with SR light is accomplished.

While, in this embodiment, the projection mirror for projecting light to the mask has been explained as provided by a cylindrical mirror, a flat mirror or a spherical mirror may be used in place of the cylindrical mirror.

Figure 11:
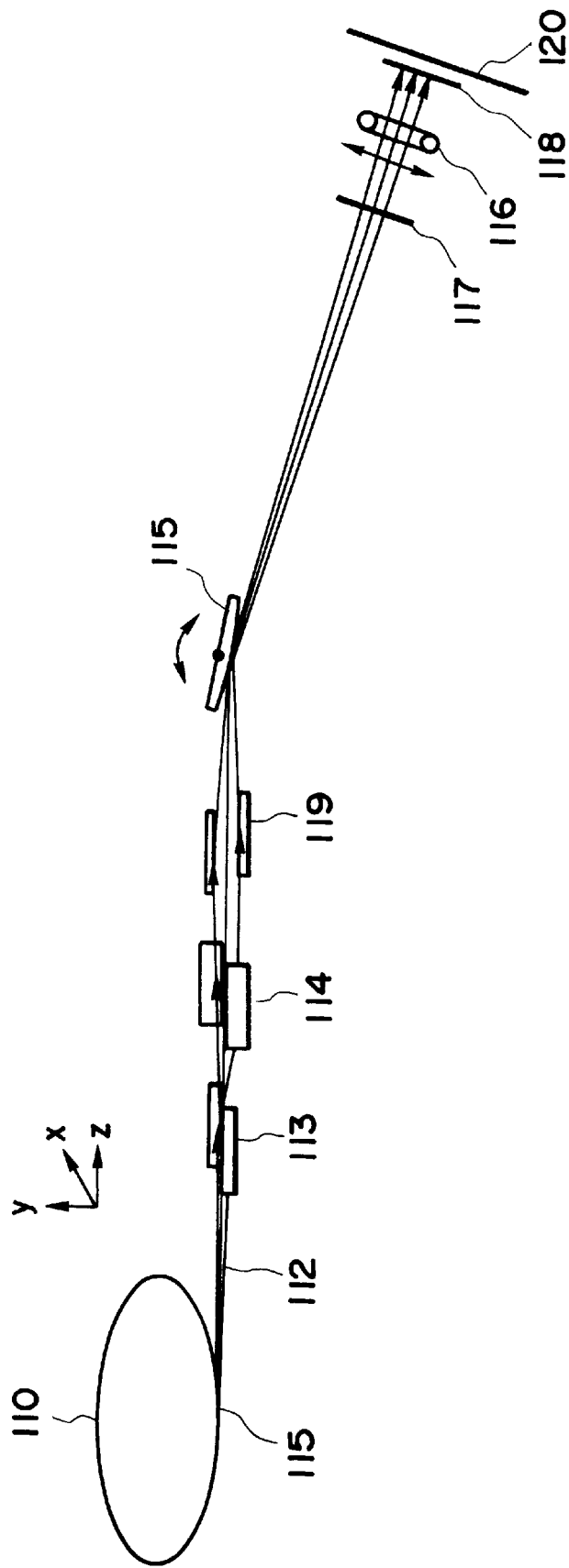
FIG. 11 is a schematic and perspective view for explaining a sixth embodiment of the present invention

Next, a sixth embodiment of the present invention will be explained, in conjunction with the drawings. FIG. 11 is a schematic and perspective view of a sixth embodiment of the present invention. FIGS. 12A and 12B are schematic views for explaining the relationship between an emission point and mirrors, wherein FIG. 12A is a side view and FIG. 12B is a top plan view. Denoted in these drawings at 110 is an SR light source, and denoted at 111 or 121 is a light emission point. Denoted at 112 or 122 is SR light, and denoted at 113 or 123 is a first-stage flat mirror. Denoted at 114 or 124 is a second-stage flat mirror, and denoted at 115 or 125 is a projection mirror (fourth-stage cylindrical mirror). Denoted at 116 is a shutter, and denoted at 117 is an X-ray transmission window. Denoted at 118 is a mask. Denoted at 119 or 129 is a projection mirror (third-stage flat mirror). Denoted at 120 is a wafer substrate, and denoted at 126 is SR light projected toward the mask.

In this embodiment, the fourth-stage flat mirrors 115 and 125 which are held fixed in the fifth embodiment are made swingable as indicated by an arrow in FIG. 11, adjacent to the fourth-stage cylindrical mirror 115, with its axis of rotation being in the horizontal plane, such that reflected SR light is diffused vertically. As seen in FIG. 12A and 12B, with the oscillation of the fourth-stage cylindrical mirror 125, the SR light impinging on the same point on the fourth-stage cylindrical mirror 125 can be formed, after the reflection, into SR light 126 having an extension in the vertical direction. In other words, with the oscillation of the fourth-stage cylindrical mirrors 115 and 125, an extension is produced in the SR light in the vertical direction as compared with the case where the mirrors are fixed.

In an X-ray exposure apparatus, the reflectivity changes largely with an incidence angle to a mirror and, therefore, rotation of the mirror causes an intensity distribution in the direction in which SR light is expanded, that is, in the vertical direction in this embodiment. The shutter 116 is made movable in the direction in which the SR light is expanded with the mirror oscillation, that is, in the vertical direction as depicted by an arrow in FIG. 11, adjacent to the shutter 116. This effectively cancels the intensity distribution caused by rotation of the mirror, and uniform exposure is assured.

More specifically, in this embodiment, a set of SR lights emitted with a large angle on both sides of the principal ray are reflected by two sets of mirrors which are disposed in a revolutionally symmetrical relation with each other about the principal ray, as shown in FIG. 11, and, additionally, the fourth-stage cylindrical mirror which receives the light projected from these mirrors is oscillated. With this structure, the SR lights are superposed one upon another on the mask, and a distribution of intensity which is easy to correct is provided on the mask.

Further, the SR light reflected by the first-stage and second-stage flat mirrors and then reflected by the third-stage flat mirrors and the SR light directly impinging from the light source are reflected by the fourth-stage cylindrical mirrors, whereby the divergence angle is expanded in the vertical direction. Thus, the region of SR light impinging on the mask is widened.

As a result, SR light emitted with a large angle is collected on the mask by deflection of the light path, whereby the intensity is increased. Also, the region to be irradiated with SR light is enlarged and, additionally, uniformization of exposure intensity is accomplished.

The structure and function of the remaining portion of this embodiment are essentially the same as those of the fifth embodiment, and a description thereof will be omitted here. While, in this embodiment, the projection mirror for projecting light to the mask has been explained as provided by a cylindrical mirror, a flat mirror or a spherical mirror may be used in place of the cylindrical mirror.

While some preferred embodiments of the present invention have been described with reference to an exposure apparatus which is usable in a device manufacturing method, a similar structure may be applied to enhancement of radiation utilization efficiency in such an exposure apparatus, as a whole.

In the embodiments of the present invention as described hereinbefore, those SR rays which are emitted at a large divergence angle in a horizontal direction from an emission point and which are not directed to a mask with conventional methods such as described in example 2) or 3), can be collected and used for illumination of an object to be illuminated. Thus, the efficiency of SR light utilization increases. When this is incorporated into the manufacture of devices such as a semiconductor device, the throughput of manufacture can be enhanced. Additionally, with the projection of SR light onto the whole mask surface, an unwanted decrease of transfer precision due to thermal distortion of a mask can be prevented and, therefore, increased yield is attainable.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for projecting radiation light from a synchrotron radiation source to an object to be illuminated, said apparatus comprising:

at least one set of flat surface mirrors disposed along a synchrotron radiation orbital plane and opposed to each other with a principal ray interposed therebetween and also disposed in two stages with respect to a direction of the principal ray, wherein a first-stage flat surface mirror of said flat surface mirrors receives radiation light, emitted from said radiation source along the synchrotron radiation orbital plane, and reflects the same toward a second-stage flat surface mirror of said flat surface mirrors, which is disposed at a side opposed to the first-stage mirror with the principal ray direction interposed therebetween; and at least one projection mirror for receiving radiation light from said flat surface mirrors and for reflecting and projecting the same toward the object to illuminate it, wherein the radiation light reflected by said second-stage flat surface mirror is deflected by said projection mirror to illuminate an effective region on the object, and the directions of said flat surface mirrors and the direction of radiation light impinging on them are placed in a predetermined relationship such that a plane defined by radiation light emitted along the synchrotron radiation orbital plane and deflected by said second-stage flat surface mirror is substantially kept unrotated about the principal ray direction with respect to the synchrotron radiation orbital plane.

2. An apparatus according to claim 1, wherein a portion of radiation light is directly projected on said projection mirror from said synchrotron radiation source, and wherein it is projected to the object together with the radiation light projected on said projection mirror from said flat surface mirrors disposed in two stages.

3. An apparatus according to claim 1, wherein at least one of said projection mirrors is swingable, such that an effective region of the object can be illuminated with an enlarged range of irradiation with radiation light, being enlarged through oscillation of said swingable mirror.

4. An apparatus according to claim 3, further comprising a shutter disposed between said projection mirror and the object to be illuminated, wherein the direction of operation of said shutter is coincident with the direction of oscillation of said swingable mirror.

5. An apparatus according to claim 1, wherein said projection mirror comprises one flat surface mirror.

6. An apparatus according to claim 1, wherein said projection mirror comprises one spherical surface mirror.

7. An apparatus according to claim 1, wherein said projection mirror comprises one cylindrical surface mirror.

8. An apparatus according to claim 1, wherein said projection mirror comprises a combination of one flat surface mirror and one spherical surface mirror.

9. An apparatus according to claim 1, wherein said projection mirror comprises a combination of two substantially opposed flat surface mirrors disposed successively from said flat mirrors, disposed in two stages, and one cylindrical mirror.

10. An apparatus according to claim 1, wherein said projection mirror comprises a combination of two substantially opposed flat surface mirrors disposed successively from said flat surface mirrors, disposed in two stages, and one spherical surface mirror.

11. An apparatus according to claim 1, wherein the object is a mask and wherein a pattern of the mask can be transferred onto a substrate through exposure.

12. A device manufacturing method comprising:

an exposure process for projecting radiation light from a synchrotron radiation source to a mask so that a pattern of the mask is transferred onto a substrate, wherein the exposure process is performed by use of an exposure apparatus which includes (i) at least one set of flat surface mirrors disposed along a synchrotron radiation orbital plane and opposed to each other with a principal ray interposed therebetween and also disposed in two stages with respect to a direction of the principal ray, wherein a first-stage flat surface mirror of the flat surface mirrors receives radiation light, emitted from the radiation source along the synchrotron radiation orbital plane, and reflects the same toward a second-stage flat surface mirror of the flat surface mirrors, which is disposed at a side opposed to the first-stage mirror with the principal ray direction interposed therebetween, and (ii) at least one projection mirror for receiving radiation light from the flat surface mirrors and for reflecting and projecting the same toward the object to illuminate it, wherein the radiation light reflected by the second-stage flat surface mirror is deflected by the projection mirror to illuminate an effective region on the object, and the directions of the flat surface mirrors and the direction of radiation light impinging on them are placed in a predetermined relationship such that a plane defined by radiation light emitted along the synchrotron radiation orbital plane and deflected by the second-stage flat surface mirror is substantially kept unrotated about the principal ray direction with respect to the synchrotron radiation orbital plane.

* * * * *

UNITED STATES PATENT AND TRADEMARK OFFICE
CERTIFICATE OF CORRECTION

PATENT NO.    : 5,923,719
DATED         : July 13, 1999
INVENTOR(S)   : Yutaka Watanabe It is certified that error appears in the above-identified patent and that said Letters Patent is hereby corrected as shown below:

<u>Title page,</u>
Item [56], FOREIGN PATENT DOCUMENTS, "0068-528-A 4/1985 Japan" should read -- 60-68538 4/1985 Japan --; and "2290-131-A 12/1987 Japan" should read -- 62-90131 12/1987 Japan --.

<u>Column 1,</u>
Line 22, "in" should read -- in the --; and
Line 31, "et al." should read -- et al., --.

<u>Column 2,</u>
Line 28, "mrad. while" should read -- mrad, while --.

<u>Column 6,</u>
Line 15, "mirrors" should read -- mirrors, --;
Line 40, "in" should read -- in a --;
Line 64, "($\cos \alpha_1 \sin \beta_1, \sin \alpha_1 \sin \beta_1, \cos \alpha_1$)." should read -- ($\cos \alpha_1 \sin \beta_1, \sin \alpha_1 \sin \beta_1, \cos \beta_1$). --; and
Line 67, "$\beta_2$ ($0 \leq \alpha_2 \leq \pi$)" should read -- $\beta_2$ ($0 \leq \beta_2 \leq \pi$) --.

<u>Column 7,</u>
Line 6, "(COS $\alpha_2 \sin \beta_2, \sin \alpha_2 \sin \beta_2, \cos \beta_2$)," should read -- ($\cos \alpha_2 \sin \beta_2, \sin \alpha_2 \sin \beta_2, \cos \beta_2$). --; and
Line 39, "direction $\pi$" should read -- direction $\phi$ --.

<u>Column 8,</u>
Line 3, "It is" should read -- It is, --.

UNITED STATES PATENT AND TRADEMARK OFFICE
CERTIFICATE OF CORRECTION

PATENT NO. : 5,923,719
DATED : July 13, 1999
INVENTOR(S) : Yutaka Watanabe

It is certified that error appears in the above-identified patent and that said Letters Patent is hereby corrected as shown below:

<u>Column 13,</u>
Line 64, "FIG." should read -- FIGS. --.

Signed and Sealed this

Ninth Day of July, 2002

Attest:

JAMES E. ROGAN
Attesting Officer     Director of the United States Patent and Trademark Office